United States Patent [19]

Lee

[11] Patent Number: 5,686,343
[45] Date of Patent: Nov. 11, 1997

[54] PROCESS FOR ISOLATING A SEMICONDUCTOR LAYER ON AN INSULATOR

[75] Inventor: Chang-Jae Lee, Seoul, Rep. of Korea

[73] Assignee: Goldstar Electron Co. Ltd., Cheongju, Rep. of Korea

[21] Appl. No.: 540,422

[22] Filed: Oct. 10, 1995

Related U.S. Application Data

[63] Continuation of Ser. No. 171,787, Dec. 22, 1993, abandoned.

[30] Foreign Application Priority Data

Dec. 22, 1992 [KR] Rep. of Korea .................... 92-24967

[51] Int. Cl.$^6$ ........................................... H01L 21/76
[52] U.S. Cl. ................. 437/62; 437/89; 148/DIG. 154
[58] Field of Search ............................ 437/62, 89, 90; 148/DIG. 85, DIG. 86, DIG. 154

[56] References Cited

U.S. PATENT DOCUMENTS

| 4,361,600 | 11/1982 | Brown | 437/62 |
| 5,308,445 | 5/1994 | Takasu | 437/89 |

FOREIGN PATENT DOCUMENTS

| 58-132919 | 8/1983 | Japan | 437/89 |
| 61-24246 | 2/1986 | Japan | 437/62 |
| 62-245646 | 10/1987 | Japan | 437/62 |
| 3-24719 | 2/1991 | Japan | 437/62 |
| 3-125458 | 5/1991 | Japan | 437/90 |

OTHER PUBLICATIONS

Wolf, S. *Silicon Processing for the VLSI Era; Process Integration* vol. 2, Lattice Press, 1990, pp. 66–78.

*Primary Examiner*—George Fourson
*Attorney, Agent, or Firm*—Loudermilk & Associates

[57] ABSTRACT

A process for the isolation of a semiconductor layer on an insulator. A process for isolating a semiconductor layer on an insulator is disclosed that includes the steps of: forming a first insulating layer on a semiconductor substrate, and opening a window by etching the first insulating layer which becomes an epitaxial growth seed; depositing a semiconductor layer and growing an epitaxial layer which has the same crystal structure as the semiconductor substrate under the window; forming an active area of the epitaxial layer by a photolithographic process; forming a second insulating layer on and at the side of the active area and on the first insulating layer; and isolating an active area from the semiconductor layer by forming a third insulator layer in the window by an oxidation process.

20 Claims, 4 Drawing Sheets

PROCESS FOR ISOLATING A SEMICONDUCTOR LAYER ON AN INSULATOR

This application is a continuation of application Ser. No. 08/171,787 filed on Dec. 22, 1993, now abandoned.

FIELD OF THE INVENTION

The present invention relates to a process for isolating a semiconductor layer on an insulator, and more particularly to a method for forming an active region on an isolation layer.

BACKGROUND OF THE INVENTION

Junction isolation, which is generally used in semiconductor devices, is not suitable for devices operated at high voltages, because if a voltage of greater than about ±30 volts is applied to the device, junction breakdown typically occurs under reasonable doping levels and device-structure dimensions. Such junction isolation also is ineffective in high-radiation environments due to transient photo-currents produced in pn junctions by gamma rays.

Therefore, it is necessary to isolate the active region of the device with an insulator surrounding the active region, rather than with a pn junction. One method of full isolation of the active region is the so called "Silicon-On-Insulator" technology.

There are various technologies to fabricate active areas (or regions) of semiconductor layers on an insulator, such as SOS (silicon on sapphire), SIMOX (separation by implanted oxygen) and FIPOS (full isolation by porous oxidized silicon).

FIGS. 1A to 1D illustrate a process of isolating a silicon layer on an insulator by the FIPOS method.

As shown in FIGS. 1A and 1B, epitaxial layer 14 is grown on silicon substrate 10 on which was formed heavily doped (p+) surface layer 12 doped with boron (B). As shown in FIG. 1C, openings are cut through epitaxial layer 14 after being lightly doped (n–), and the entire heavily doped silicon region under epitaxial layer portions 14a between the etched recesses is converted to porous silicon 12a by employing anodization of the heavily p-doped layer with an HF solution to preferentially render the silicon porous. As shown in FIG. 1D, active area 14a is fully surrounded by oxide layer 12b at the bottom and natural oxide 14b which is formed on the surface of active area 14a, resulting in electrical isolation from silicon substrate 10.

FIG. 2 illustrates a process of isolating a silicon layer on insulator by what is known as the Recessed Local Oxidation Method (RLOM), where a selective oxidation beneath a top silicon region is used to form the SOI structure.

As shown in FIG. 2A, an epitaxial layer is grown on silicon substrate 21, and a portion of the epitaxial layer is removed by anisotropic etching to form an epitaxial layer portion as active area 26. Silicon oxide layer 22—22' is formed on the surface of silicon substrate 21 and active area 26. Double nitride layer 23 and 24 is created on silicon oxide layer 22—22', where one nitride layer 24 is formed on the sides of silicon oxide layer 22—22', and second nitride layer 23 is formed on the surface of silicon oxide layer 22—22'. As shown in FIG. 2B, trenches 21' are formed by an isotropic etching, creating an undercut structure at the bottom of active area 26. As shown in FIG. 2C, this structure is then thermally oxidized until silicon island active area 26 is electrically isolated from substrate 21, forming silicon oxide layer 25. As shown in FIG. 2D, trenches 21' are filled with polysilicon 27 and CVD silicon oxide 28 to form a planar-surface topography, with nitride layer 23 removed before planarization.

In the FIPOS process, one of the main problems is that a variety of non-conventional silicon-processing steps must be developed in order to implement the process, which steps include the anodization process to form the porous silicon layer and an oxidation and anneal sequence for this layer. As a result, contamination may be generated on the silicon wafer and control of forming the porous silicon layer is very difficult in the anodization process.

In the RLOM process, one obvious difficulty with this method is that the width of the silicon islands created is quite small, and there also exists the possibility of defect generation resulting from the growth of the oxide in a confined area (undercutting).

SUMMARY OF THE INVENTION

The present invention is intended to overcome disadvantages of the above-described conventional processes. It is an object of the present invention to provide a simple process of isolating an active area for forming a semiconductor layer on an insulator.

In achieving this and other objects, a process for isolating a semiconductor layer on an insulator according to the present invention includes the steps of: forming a first insulating layer on a semiconductor substrate, and opening a window which becomes an epitaxial growth seed by etching the first insulating layer; depositing a semiconductor layer and growing an epitaxial layer which has the same crystal structure as the semiconductor substrate from the substrate under the window; forming an active area of the epitaxial layer by a photolithographic process; forming a second insulating layer on and at the sides of the active area, and on the first insulating layer, and isolating an active area from the semiconductor layer by forming a third insulator layer in the window by an oxidation process.

Another process for isolating an active region of a semiconductor layer on an insulator layer according to the present invention includes the steps of: forming a first insulating layer on a semiconductor substrate, and opening a window for an epitaxial layer growth seed by partially etching the first insulator layer; depositing a semiconductor layer on the window and the first insulating layer, and growing an single crystalline epitaxial semiconductor layer from the substrate under the window; forming a second insulator layer on the epitaxial layer and forming an active area pattern with the second insulating area remaining thereon; forming a third insulator layer at both side of the active area and the remaining second insulating layer, and forming an insulator layer by an oxidizing a portion of semiconductor area near the window by diffusion of oxidant from the first insulator layer.

BRIEF DESCRIPTION OF THE DRAWINGS

The above objects and other advantages of the present invention will be more apparent by describing in detail the preferred embodiments of the present invention with reference to the attached drawings.

DESCRIPTION OF THE PREFERRED EMBODIMENTS

FIG. 3 illustrates a process for isolating a semiconductor layer on an insulator according to the present invention.

Figure 1A:
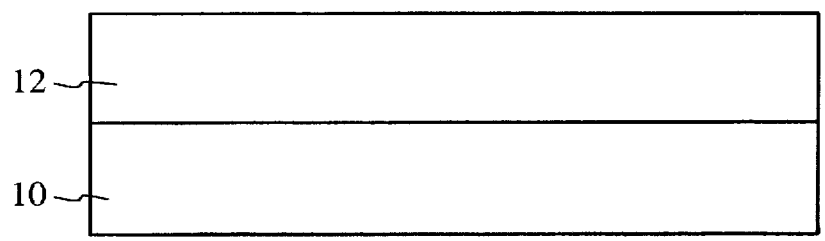
FIGS. 1A–1D are sectional views illustrating a process for isolating a semiconductor layer on an insulator according to a conventional process.
Figure 1B:
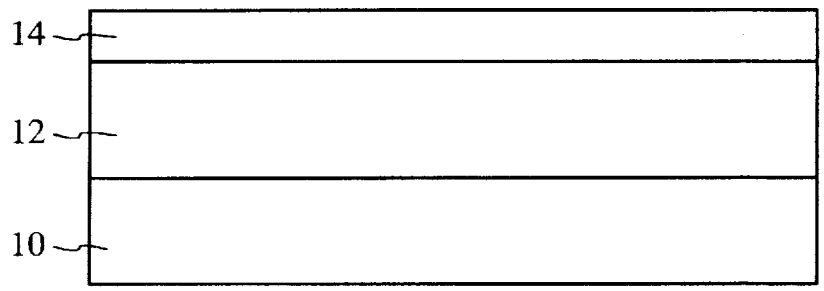
Figure 1C:
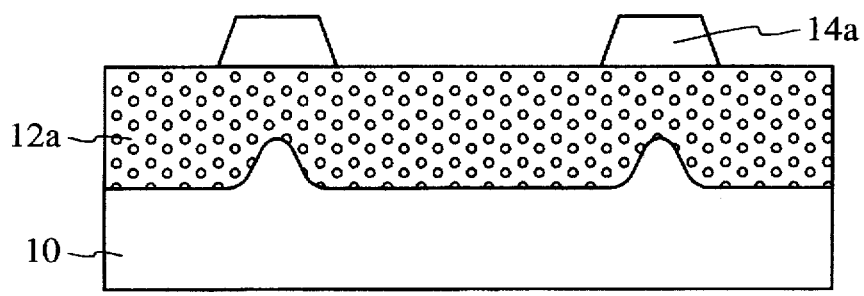
Figure 1D:
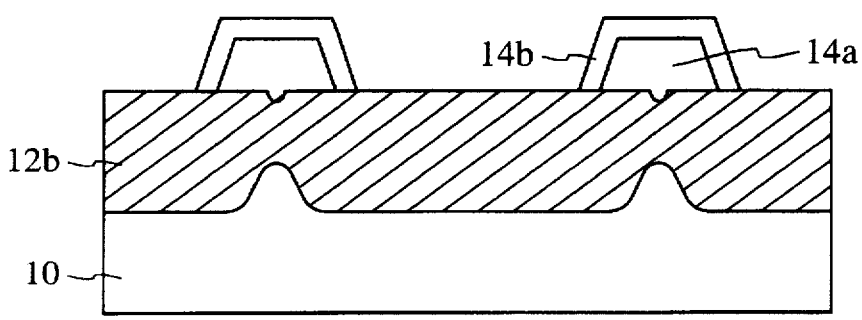
Figure 2A:
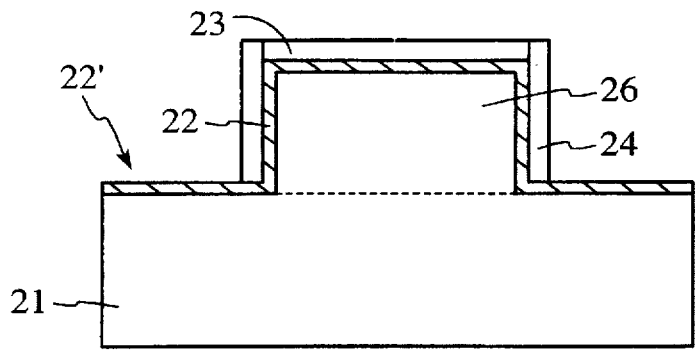
FIGS. 2A–2D are sectional views illustrating a process for isolating a semiconductor layer on an insulator according to another conventional process.
Figure 2B:
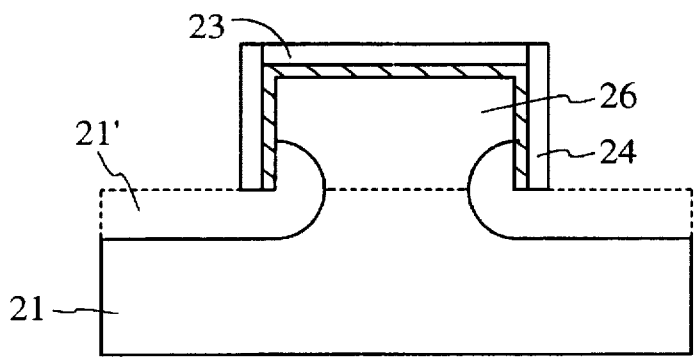
Figure 2C:
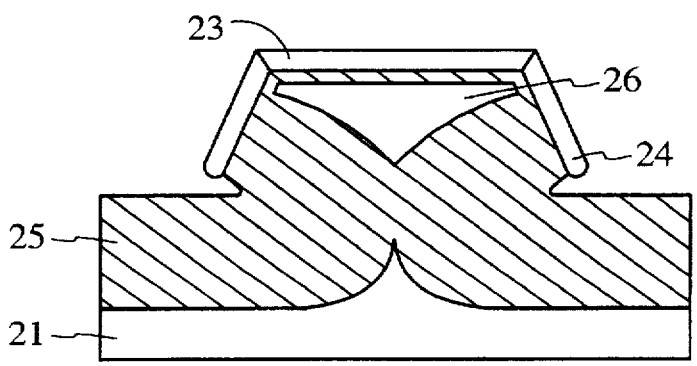
Figure 2D:
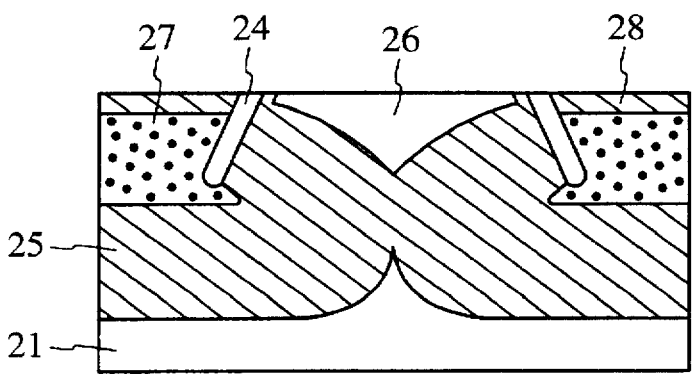
Figure 3A:
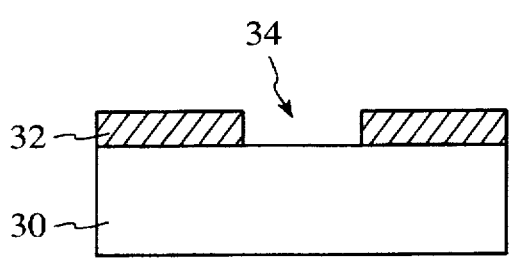
FIGS. 3A–3H are sectional views illustrating a process for isolating a semiconductor layer on an insulator according to the present invention.

As shown in FIG. 3A, silicon oxide layer 32 as a first insulating layer is deposited on silicon substrate 30, and photoresist (not shown) is coated on first insulating layer 32, exposed and developed, forming a photoresist pattern for opening a window. Window 34, which permits the substrate under the window to become an epitaxial growth seed, is opened by anisotropic etching portions of first insulating layer 32 which are not protected by the photoresist pattern. The remaining portions of silicon oxide layer 32 will be used as a path through which an oxidant passes to be diffused in an oxidization process.

Figure 3E:
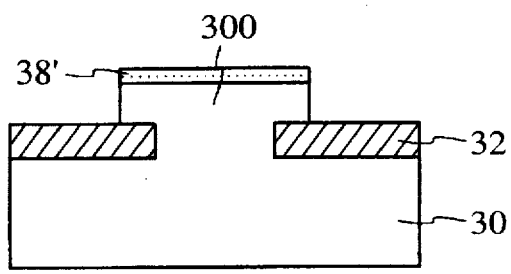
Figure 3B:
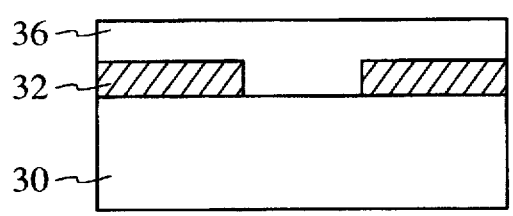

As shown in FIG. 3B, amorphous silicon layer 36 is deposited in window 34 on the seed and on first insulating layer 32 by means of a chemical vapor deposition (CVD) method after removal of the photoresist pattern. As shown in FIG. 3C, epitaxial layer 30' is formed from the seed by annealing amorphous silicon layer 36.

Figure 3F:
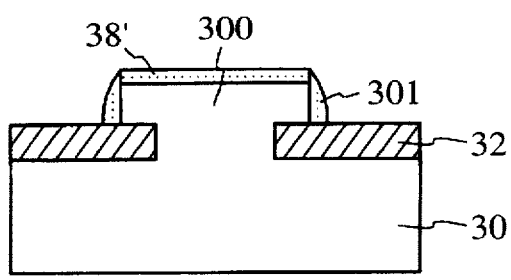
Figure 3C:
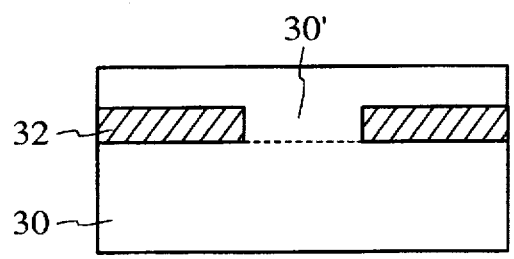
Figure 3G:
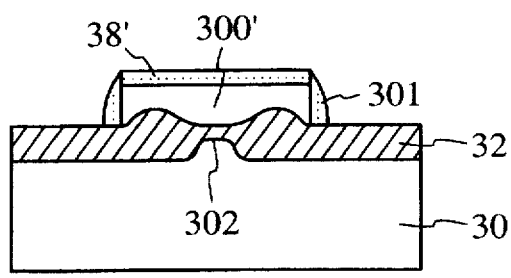
Figure 3D:
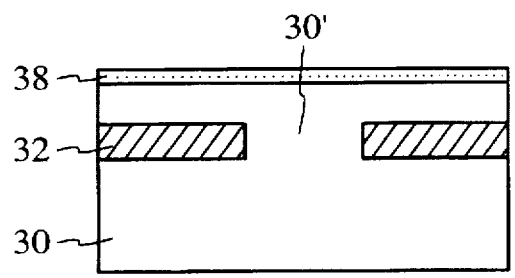

As shown in FIG. 3D, silicon nitride layer 38 as a second insulating layer is deposited on epitaxial layer 30'. As shown in FIG. 3E, after photoresist (not shown) is coated on second insulating layer 38 and a photoresist pattern (not shown) is defined with a photo-mask for defining an active area by exposure and development, active area 300 is defined by means of anisotropic etching both second insulating layer of silicon nitride 38 and epitaxial layer 30'. The remaining portions of first insulating layer of silicon oxide 32 is used as an etch-stop layer, with the result that the surface of active area 300 is insulated with the remaining portions of silicon nitride layer 38'. Thereafter the photoresist pattern is removed.

As shown in FIG. 3F, a silicon nitride layer as a third insulating layer is deposited on the surface and side of active area 300 and on first insulating layer 32, and sidewall spacer 301 of the third insulating layer is formed on the sides of active area 300 and the remaining portions of silicon nitride layer 38' by anisotropic etching of the third insulating layer of silicon nitride until the silicon oxide of first insulating layer 32 is exposed. As shown in FIG. 3G, active area 300 is isolated electrically from silicon substrate 30 by a thermal oxidization in which an oxidant is diffused through silicon oxide layer 32, forming silicon island 300'.

Figure 3H:
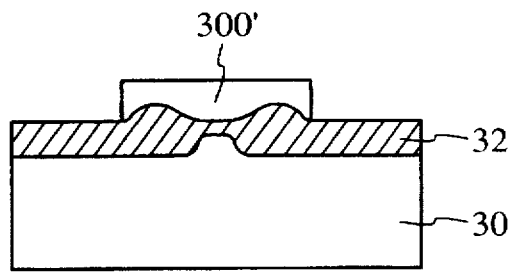

Since the oxidization progresses laterally to form silicon oxide 302, epitaxial silicon in the area of window 34 turns into silicon oxide to form fourth insulating layer 302 which fills window 34 of FIG. 3A, resulting in the isolated active area of silicon island 300'. As shown in FIG. 3H, the insulating layers including side wall spacer 301 and silicon nitride layer 38' of the second insulating layer, but not the silicon oxide of first insulating layer 32, are eliminated, resulting in the fully isolated semiconductor layer 300' (silicon island) on insulator.

In other embodiments, polysilicon is utilized instead of amorphous silicon for layer 36.

FIG. 4 illustrates another process for the isolation of a semiconductor layer on an insulator according to the present invention.

Figure 4A:
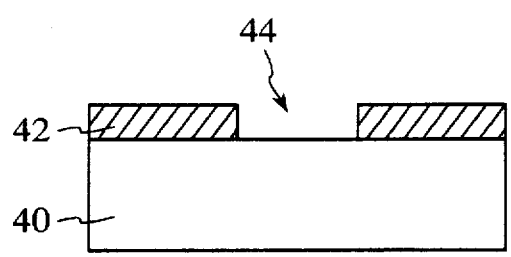
FIGS. 4A–4H are sectional views illustrating another process for isolating a semiconductor layer on an insulator according to the present invention.

As shown in FIG. 4A, silicon oxide layer 42 as a first insulating layer is deposited on a silicon substrate 40, and photoresist (not shown) is coated on first insulating layer 42, exposed and developed, forming a photoresist pattern (not shown) for forming an window. Window 44 is opened by anisotropic etching the portions of first insulating layer 42 that are not protected by the photoresist pattern. The remaining portions of first insulating layer of silicon oxide 42 will be used as a path through which an oxidant passes to be diffused in an oxidization process, and the window becomes a path for epitaxial growing from the substrate (acting as a seed) under the window.

Figure 4E:
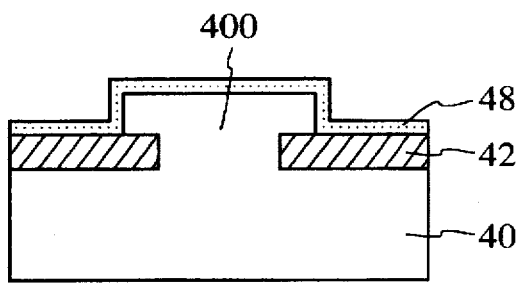
Figure 4B:
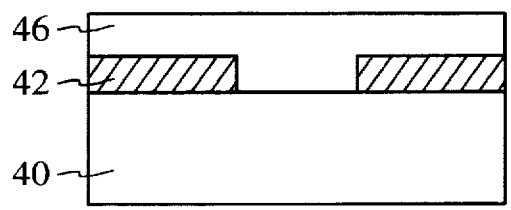

As shown in FIG. 4B, amorphous silicon layer 46 is deposited in window 44 and on the seed presented by the substrate and on first insulating layer 42 by means of a chemical vapor deposition (CVD) method after removal of the photoresist pattern. As shown in FIG. 4C, epitaxial layer 40' grows from seed 44 by annealing of amorphous silicon layer 46. Epitaxial layer 40' is converted from amorphous silicon 46 into the same material (crystal structure) as that of silicon substrate 40.

Figure 4F:
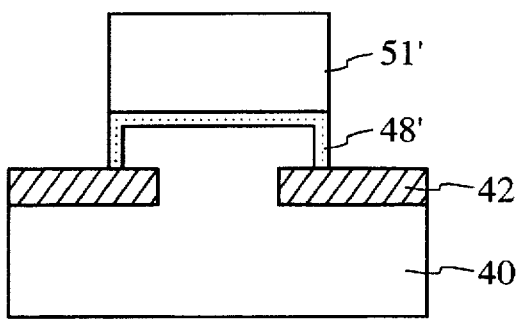
Figure 4C:
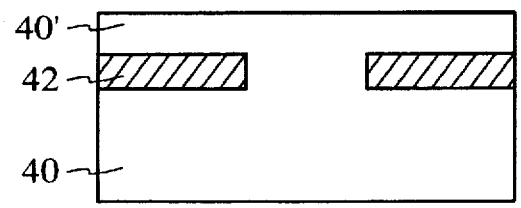
Figure 4G:
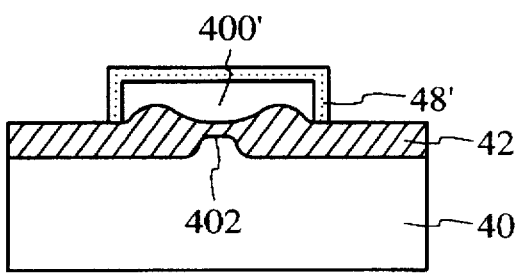
Figure 4D:
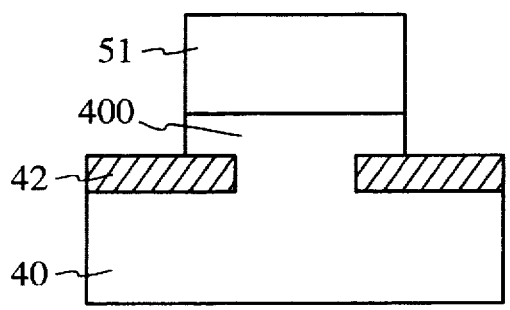

As shown in FIG. 4D, photoresist is coated on epitaxial layer 40', and photoresist pattern 51 is defined by exposure with a mask for an active area, and then developed. Using photoresist pattern 51 as an etch mask, active area 400 is formed by anisotropic etching of epitaxial layer 40'. As shown in FIG. 4E, after photoresist pattern 51 is removed, second insulating layer 48 of silicon nitride is deposited on the surface of first insulating layer 42, and on and along the sides of active area 400.

As shown in FIG. 4F, photoresist is coated on second insulating layer 48 of silicon nitride, and photoresist pattern 51' is defined by exposure with a mask, which is larger than the usual mask for defining an active area, and then developed.

Second insulating layer 48 is etched anisotropically, in which first insulating layer 42 is used as an etch-stop layer. The remaining portions of second insulating layer 48', which are protected by photoresist pattern 51' and located on the surface and sides of active area 400, prevent active area 400 from being oxidized in an oxidization process. As shown in FIG. 4G, active area 400 is isolated electrically from silicon substrate 40 by a thermal oxidization in which an oxidant is diffused through silicon oxide layer 42, forming silicon island 400'. Since the oxidization progresses laterally to form silicon oxide, epitaxial silicon in the area of window 44 turns into silicon oxide to form fourth insulating layer 402 filling window 44 of FIG. 4A, resulting in the isolated active area of silicon island 400'.

Figure 4H:
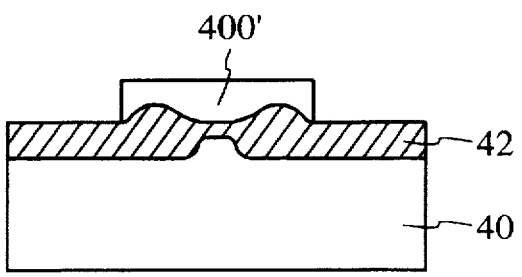

As shown in FIG. 4H, silicon nitride 48' of the second insulating layer is etched isotropically, resulting in fully isolated semiconductor layer 400' (silicon island) on an insulator.

In other embodiments, polysilicon is utilized instead of amorphous silicon for layer 46.

According to the present invention as described above, silicon-processing steps become simpler to implement over prior processes. The present invention does not include the anodization process to form a porous silicon layer, or the oxidation and anneal sequence for this layer.

Accordingly contamination problems are diminished on the silicon wafer so that crystallinity of the silicon in the active area is improved. Further, the present invention also provides for sufficient width of the islands which reduces the possible generation of defects from the growth of the oxide in a confined area of the undercutting. Consequently, the present invention provides a process that enables the fabrication of semiconductor devices of high speed and excellent quality.

Although various preferred embodiments of the present invention have been disclosed for illustrative purposes, those skilled in the art will appreciate that various modifications, additions and/or substitutions are possible without departing from the scope and spirit of the present invention as disclosed in the claims.

What is claimed is:

1. A process for isolating a semiconductor layer on an insulator, comprising the steps of:
   depositing an oxide layer as a first insulator layer on a semiconductor substrate, and selectively etching the first insulator layer to open a window to the substrate;
   forming a semiconductor layer in the window and on the first insulating layer and converting the crystal structure of the semiconductor layer, wherein the crystal structure of the semiconductor layer is based on the crystal structure of the semiconductor substrate;
   patterning the semiconductor layer by a photolithographic process to form an active area having a top and sides; and
   forming a second insulator layer on the top and along the sides of the active area and on the first insulator layer, and isolating the active area from the substrate by forming a third insulator layer in the window by an oxidation process.

2. The process of claim 1, wherein the first insulator layer comprises silicon oxide.

3. The process of claim 1 wherein the second insulator layer is used as an oxidation-stop layer.

4. The process of claim 1, wherein the second insulator layer comprises silicon nitride.

5. The process of claim 1, wherein the semiconductor layer formed in the window and on the first insulating layer comprises polysilicon, wherein the crystal structure of the semiconductor layer is converted to the crystal structure of the semiconductor substrate.

6. The process of claim 1, wherein the semiconductor layer formed in the window and on the first insulating layer comprises amorphous silicon, wherein the crystal structure of the semiconductor layer is converted to the crystal structure of the semiconductor substrate.

7. The process of claim 1, wherein the second insulator layer formed along the sides of the active area is formed by anisotropic etching of the second insulator layer.

8. The process of claim 1, further comprising the step of removing the second insulator layer after the isolation of the active area.

9. The process of claim 1, wherein the step of forming a second insulator layer on the top and along the sides of the active area and on the first insulator layer comprises first forming a first nitride layer, patterning the first nitride layer so as to remain on the top of the active area, forming a second nitride layer, and anisotropic etching of the second nitride layer so as to form nitride side walls along the sides of the active area.

10. The process of claim 1, wherein the crystal structure of the semiconductor substrate opened by the window forms an epitaxial growth seed.

11. A process for isolating a semiconductor layer on an insulator, comprising the steps of:
   depositing an oxide layer as a first insulator layer on a semiconductor substrate, and opening a window to the semiconductor substrate by selectively etching the first insulator layer;
   depositing a semiconductor layer in the window to the semiconductor substrate and on the first insulator layer, and growing a single crystalline epitaxial semiconductor layer from the substrate through the window;
   forming a second insulator layer on the epitaxial semiconductor layer, and patterning the second insulator layer and the epitaxial semiconductor layer to form an active area having a top surface and sides with the second insulator area remaining on the top surface thereof;
   forming a third insulator layer along the sides of the active area and on the remaining second insulating layer, and forming a fourth insulator layer by oxidizing a portion of the epitaxial semiconductor layer and the semiconductor substrate in the window by diffusion of oxidant from the first insulator layer, wherein the active area is isolated from the semiconductor substrate.

12. The process of claim 11, wherein the first insulator layer comprises silicon oxide.

13. The process of claim 11, wherein the second insulator layer is used as an oxidation-barrier layer.

14. The process of claim 11, wherein the second insulator layer comprises silicon nitride.

15. The process of claim 11, wherein the semiconductor layer comprises polysilicon.

16. The process of claim 11, wherein the semiconductor layer comprises amorphous silicon.

17. The process of claim 11, further comprising the step of removing the second and third insulator layers after the isolation of the active area.

18. The process of in claim 17, wherein the second and third insulating layers are removed by isotropic etching.

19. The process of claim 11, wherein the window to the semiconductor substrate forms an epitaxial growth seed.

20. A process for forming an active semiconductor area surrounded by an insulator, comprising the steps of:
   depositing an oxide layer as a first insulator layer on the surface of a semiconductor substrate;
   forming a window in the first insulator layer to the surface of the semiconductor substrate; forming a polysilicon or amorphous silicon layer over the surface of the first insulator layer and filling the window to the substrate;
   forming an active semiconductor layer by converting the crystal structure of the polysilicon or amorphous silicon layer based on the crystal structure of the semiconductor substrate;
   patterning the active semiconductor layer to form an active semiconductor area having a top and sides;
   forming a second insulator layer on the top and along the sides of the active semiconductor area, the second insulator layer being resistant to oxidation;
   forming a third insulator layer on the surface of the semiconductor substrate within the window by an oxidation process, wherein portions of the active semiconductor area and the semiconductor substrate are oxidized, wherein the active semiconductor area is isolated from the semiconductor substrate.

* * * * *